(12) United States Patent
Lee et al.

(10) Patent No.: US 8,008,661 B2
(45) Date of Patent: Aug. 30, 2011

(54) INSERT MODULE FOR A TEST HANDLER

(75) Inventors: Young-Chul Lee, Asan-si (KR);
Jeong-Tae Choi, Cheonan-si (KR);
Dong-Gu Kim, Cheonan-si (KR);
Woon-Sik Kim, Cheonan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 93 days.

(21) Appl. No.: 12/638,292

(22) Filed: Dec. 15, 2009

(65) Prior Publication Data

US 2010/0155725 A1  Jun. 24, 2010

(30) Foreign Application Priority Data

Dec. 19, 2008  (KR) ........................ 10-2008-0129836

(51) Int. Cl.
*H01L 23/34* (2006.01)
(52) U.S. Cl. .................. 257/48; 257/E23.002
(58) Field of Classification Search .................. 257/48, 257/678, 690, E23.002; 414/806
See application file for complete search history.

(56) References Cited

U.S. PATENT DOCUMENTS

| | | | | |
|---|---|---|---|---|
| 5,825,195 A * | 10/1998 | Hembree et al. | ......... | 324/750.23 |
| 6,262,581 B1 * | 7/2001 | Han | ......... | 324/756.02 |
| 6,335,629 B1 * | 1/2002 | Lee et al. | ......... | 324/750.2 |
| 6,909,298 B2 * | 6/2005 | Gabriel et al. | ......... | 324/754.05 |
| 7,129,722 B1 * | 10/2006 | Brophy et al. | ......... | 324/750.25 |
| 7,514,946 B2 * | 4/2009 | Soeta et al. | ......... | 324/750.09 |
| 7,807,481 B2 * | 10/2010 | Tashiro et al. | ......... | 438/14 |
| 2007/0138466 A1 * | 6/2007 | Lee et al. | ......... | 257/48 |
| 2009/0245982 A1 * | 10/2009 | Na et al. | ......... | 414/226.04 |

FOREIGN PATENT DOCUMENTS

| JP | 11-186786 | 7/1999 |
|---|---|---|
| KR | 1019990029935 | 4/1999 |
| KR | 10-0243938 | 11/1999 |
| KR | 1020050061392 | 6/2005 |

* cited by examiner

*Primary Examiner* — Nathan W Ha
(74) *Attorney, Agent, or Firm* — F. Chau & Associates, LLC

(57) ABSTRACT

An insert module for a test handler includes an insert body and a support frame. The insert body has a receiving space for receiving a semiconductor device. The semiconductor device having connection pads protruding externally from a surface of the semiconductor device. The support frame is formed in an inner side portion of the insert body defining the receiving space to provide a seating surface for contacting and supporting the semiconductor device. The support frame includes a fixing frame and a guide pattern. The fixing frame is inserted into and fixed with the insert body and defines an opening that exposes the semiconductor device. The guide pattern extends from the fixing frame to the inside of the opening to contact the semiconductor device and guide the connection pads.

12 Claims, 8 Drawing Sheets

INSERT MODULE FOR A TEST HANDLER

CROSS-REFERENCE TO RELATED PATENT APPLICATION

This application claims priority under 35 U.S.C. §119 to Korean Patent Application No. 2008-129836, filed on Dec. 19, 2008, the disclosure of which is hereby incorporated by reference herein in it's entirety.

BACKGROUND

1. Technical Field

Example embodiments relate to an insert module for a test handler and to a method of manufacturing the insert module for a test handler. More particularly, example embodiments relate to an insert module for a test hander capable of seating a semiconductor device for testing the semiconductor device and to a method of manufacturing the insert module for a test handler.

2. Description of the Related Art

Generally, semiconductor devices completed by manufacturing processes go through an inspection process for inspecting electrical properties thereof. The inspection process may be performed using an automatic inspection apparatus such as, for example, a test handler.

The semiconductor device may include a plurality of connection pads that protrude externally from a molding resin for protecting the semiconductor device from the outside. In the inspection process, the connection pads of the semiconductor device may be electrically connected to a socket of a test board of the test handler.

Nowadays, as the semiconductor devices are highly integrated, a pitch between the connection pads may be decreased. Additionally, a chip scale package (for example, Edge Margin Less (EML) package) having a very small edge margin between the outermost connection pad and the edge of the semiconductor device has been manufactured.

Accordingly, there is a need in the art for an insert module having a new structure capable of inserting and holding the semiconductor device for the testing of the semiconductor device, and wherein the semiconductor device has a reduced edge margin and the connection pads are arranged at a small distance from one another. Further, there is a need in the art for an insert module having a support structure capable of supporting the semiconductor device, and wherein the support structure has improved durability and surface characteristics.

SUMMARY

Example embodiments may provide an insert module for a test handler capable of inserting and holding a semiconductor device for testing the semiconductor device, and wherein the semiconductor device has a reduced edge margin and connection pads of the semiconductor device are arranged at a small distance from one another.

Example embodiments may provide a method of manufacturing the insert module for a test handler.

According to some example embodiments, an insert module for a test handler includes an insert body and a support frame. The insert body has a receiving space for receiving a semiconductor device. The semiconductor device has connection pads protruding externally from a surface of the semiconductor device. The support frame is formed in an inner side portion of the insert body defining the receiving space to provide a seating surface for contacting and supporting the semiconductor device. The support frame includes a fixing frame and a guide pattern. The fixing frame is inserted into and fixed with the insert body and defines an opening that exposes the semiconductor device. The guide pattern extends from the fixing frame to the inside of the opening to contact the semiconductor device and guide the connection pads.

In an example embodiment, the opening may have an area corresponding to a plane area of the semiconductor device.

In an example embodiment, the guide pattern may be formed in the peripheral region of the opening and the guide pattern may guide the connection pads arranged in the peripheral region of the semiconductor device.

In an example embodiment, the insert body may include a resin and the support frame may include a metal treated by antistatic additives. For example, the support frame may include copper (Cu), aluminum (Al) or lead (Pb). These may be used alone or in a combination thereof.

In an example embodiment, the guide pattern may be formed by performing a photolithography process on a metal film. The support frame may be formed integrally with the insert body by an injection molding process to form the insert module.

In an example embodiment, a width of the guide pattern may be no more than about 0.14 mm. The outermost connection pad of the externally protruding connection pads may be spaced apart from the edge of the semiconductor device by no more than about 0.1 mm. A thickness of the guide pattern may be no more than about 0.14 mm.

According to some example embodiments, in a method of manufacturing an insert module for a test handler, a mold for forming an insert body is prepared. The insert body has a receiving spacer for receiving a semiconductor device having externally protruding connection pads. A support frame including a metal treated by antistatic additives is formed. The support frame has a fixing frame and a guide pattern. The fixing frame has an opening that exposes the semiconductor device. The guide pattern extends from the fixing frame to the inside of the opening. The support frame is inserted into the mold such that the support frame is positioned in an inner side portion of the insert body defining the receiving space. A molten resin is injected into a cavity of the mold. The resin is cooled and solidified. The solidified resin is then separated from the mold.

In an example embodiment, forming the support frame may include forming a metal film, performing a photolithography process on the metal film to form a preliminary support frame having the fixing frame and the guide pattern, and treating the preliminary support frame by antistatic additives to form the support frame.

In an example embodiment, forming the metal film may include depositing a metal material on a substrate. For example, the metal material may include copper (Cu), aluminum (Al) or lead (Pb).

In an example embodiment, treating the preliminary support frame by antistatic additives may include coating the antistatic additives on a surface of the preliminary support frame.

In an example embodiment, the opening of the support frame may have an area corresponding to a plane area of the semiconductor device.

In an example embodiment, the guide pattern of the support frame may be formed in the peripheral region of the opening.

In an example embodiment, a width of the guide pattern may be no more than about 0.14 mm. The outermost connection pad of the externally protruding connection pads may be spaced apart from the edge of the semiconductor device by no more than about 0.1 mm. A thickness of the guide pattern may be no more than about 0.14 mm.

According to some example embodiments, an insert module for a test handler includes a resin insert body having a receiving space for receiving a semiconductor device and a metal support frame integrally formed in the insert body. The support frame has a guide pattern that contacts the semiconductor device and guides connection pads of the semiconductor device.

As a photolithography process is performed on a metal film to form the support frame, the support frame may have a thickness and a width smaller than those of a conventional resin support structure. Further, the support frame may have improved hardness and durability, small deflection and uniform surface characteristics, compared with a conventional resin support structure.

Accordingly, the guide pattern of the support frame may guide and support the outermost connection pads that are formed spaced apart by no more than about 0.1 mm from the edge of the semiconductor device.

BRIEF DESCRIPTION OF THE DRAWINGS

Example embodiments will be more clearly understood from the following detailed description taken in conjunction with the accompanying drawings.

DETAILED DESCRIPTION OF THE EXAMPLE EMBODIMENTS

Figure 1:
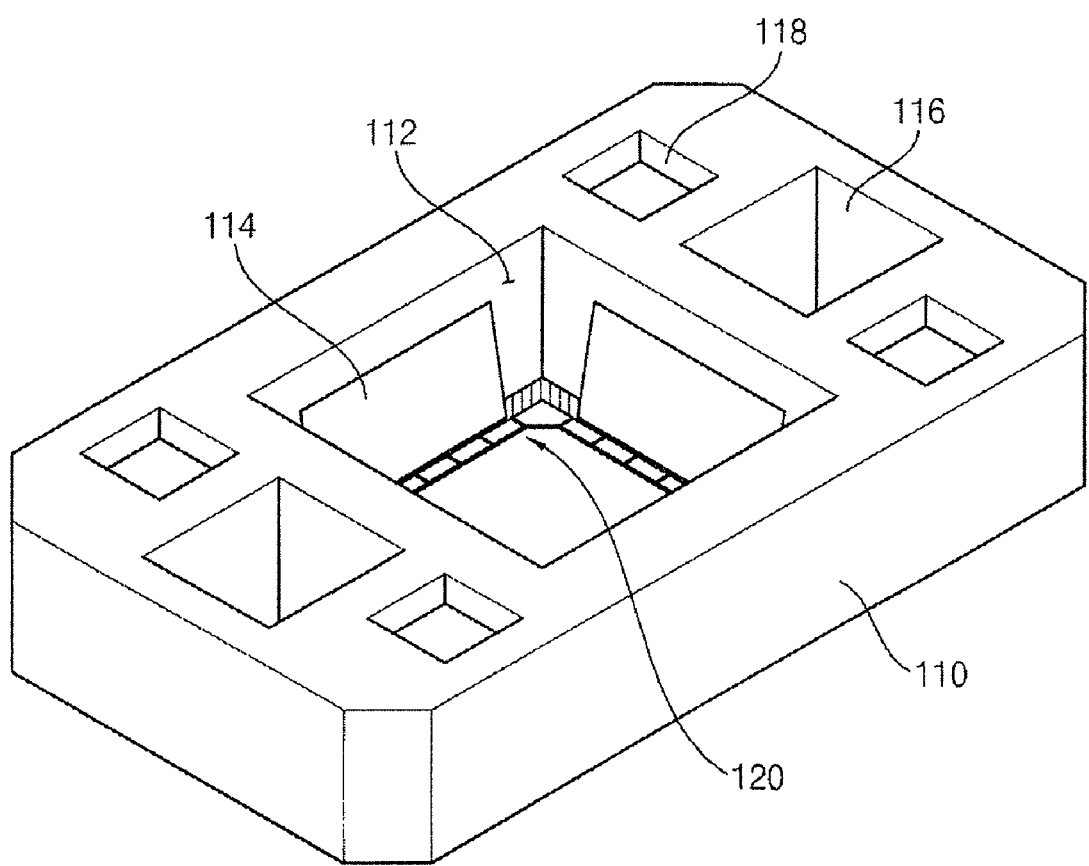
FIG. 1 is a perspective view illustrating an insert module for a test handler in accordance with an example embodiment.

Various example embodiments will be described more fully hereinafter with reference to the accompanying drawings, in which some example embodiments are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
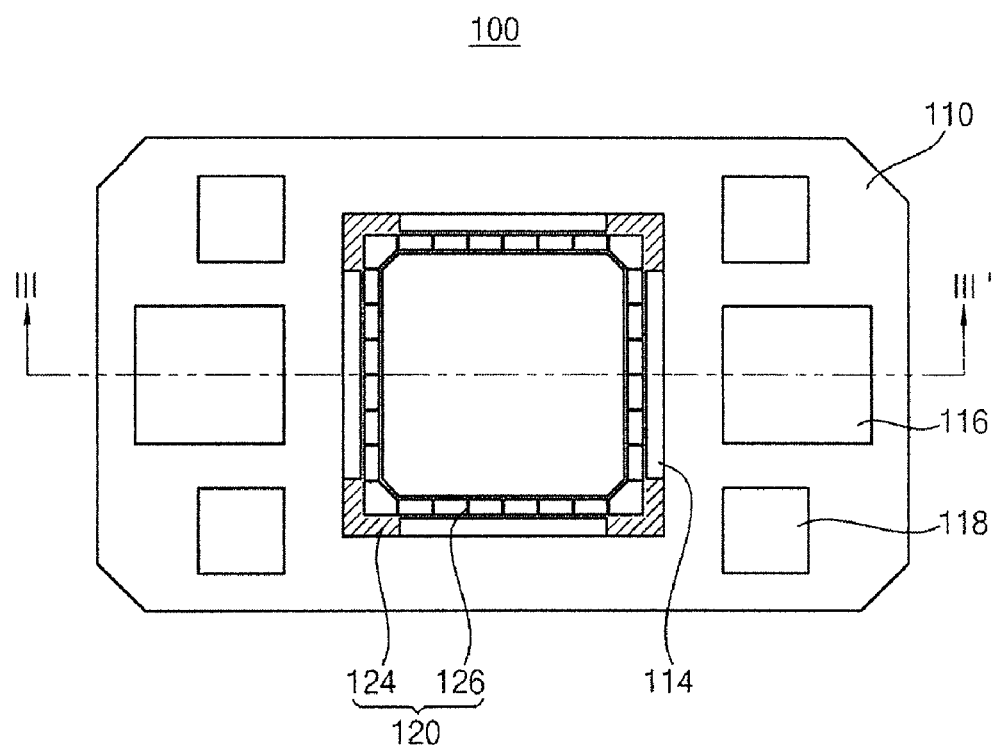
FIG. 2 is a plan view illustrating the insert module in FIG. 1.
Figure 3:
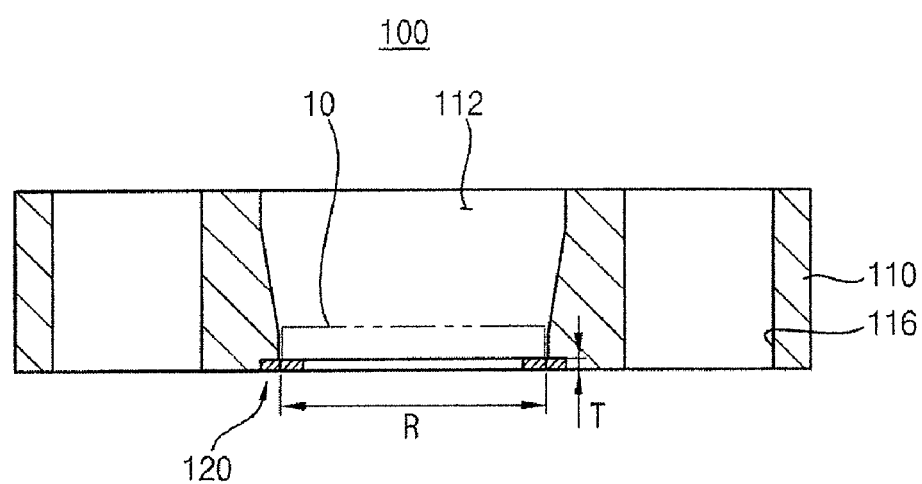
FIG. 3 is a cross-sectional view taken along a line III-III' in FIG. 2.
Figure 4:
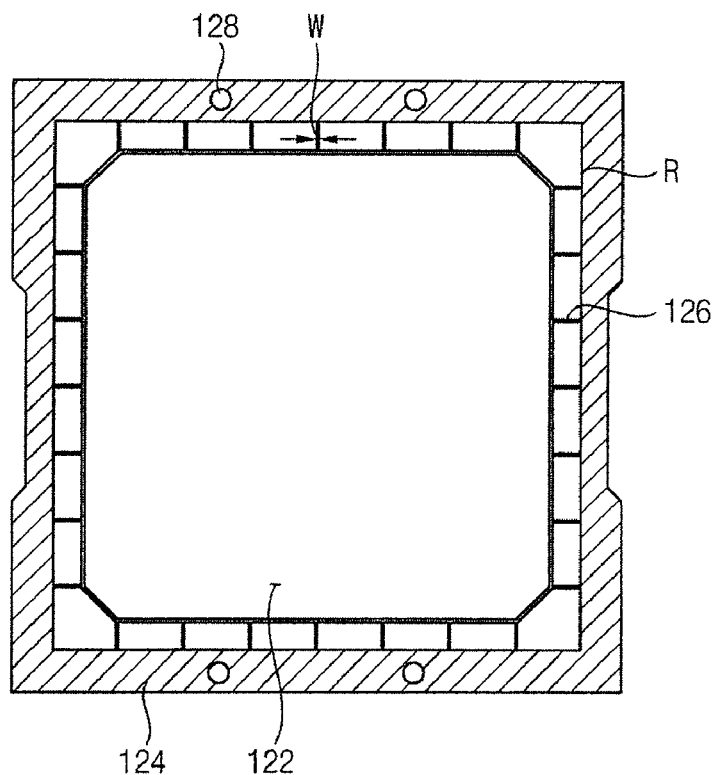
FIG. 4 is a plan view illustrating a support frame formed in the insert module in FIG. 1.
Figure 5:
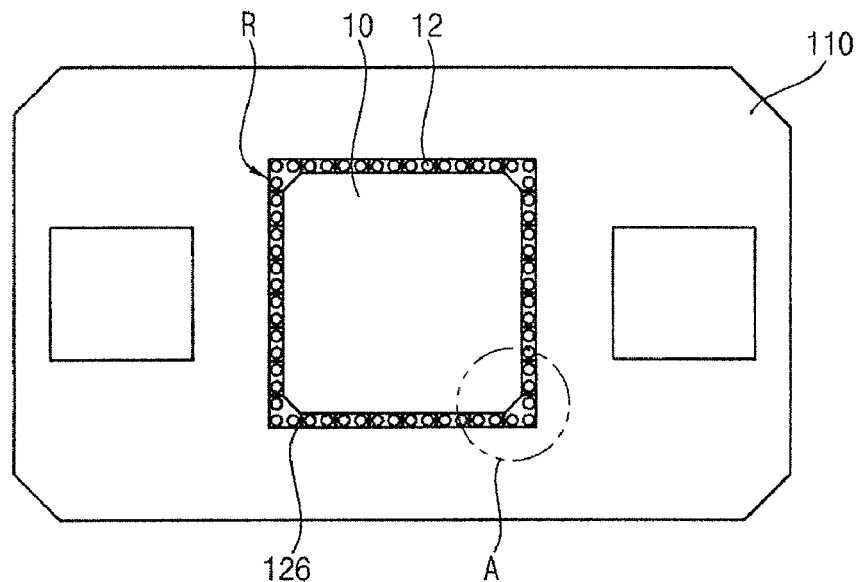
FIG. 5 is a bottom view illustrating the insert module where a semiconductor device is to be inserted in FIG. 1.

FIG. 1 is a perspective view illustrating an insert module for a test handler in accordance with an example embodiment. FIG. 2 is a plan view illustrating the insert module in FIG. 1. FIG. 3 is a cross-sectional view taken along a line in FIG. 2. FIG. 4 is a plan view illustrating a support frame formed in the insert module in FIG. 1. FIG. 5 is a bottom view illustrating the insert module where a semiconductor device is to be inserted in FIG. 1.

Referring to FIGS. 1 to 5, an insert module 100 for a test handler includes an insert body 110 configured for inserting a semiconductor device 10 thereto and a support frame formed in the insert body 110 to contact and support the semiconductor device 10.

In an example embodiment, the insert module 100 for a test handler may receive and hold the semiconductor device 10 such as a semiconductor package to be tested. The semiconductor device 10 may have connection pads 12. The connection pads 12 may be formed on a surface of the semiconductor device 10. The connection pads 12 may protrude externally from the surface of the semiconductor device 10.

The insert body 110 may have a receiving space 112 where the semiconductor device 10 is to be inserted. For example, the insert body 110 may have a rectangular parallelepiped shape. The receiving space 112 may be formed to penetrate the insert body 110. The receiving space 112 may extend from an upper surface to a lower surface of the insert body 110.

In an example embodiment, guide portions 114 may be formed on side faces of the receiving space 112. The guide portion 114 may have a plane inclined with respect to an inserting direction of the semiconductor device 10. When the semiconductor device 10 is inserted obliquely into the receiving space 112, the guide portion 114 may provide self-alignment of the semiconductor device 10 at a desired position in the receiving space 112. A guiding hole 116 and combining holes 118 may be formed in both side portions of the insert body 110 for the guiding of and combining of the insert module 100 in the test handler.

The support frame 120 is formed in an inner side portion of the insert body 110 defining the receiving space 112, to provide a seating surface for contacting and supporting the surface of the semiconductor device 10.

In an example embodiment, the support frame 120 may include a fixing frame 124 and a guide pattern 126. The fixing frame 124 may be inserted into and fixed to the insert body 110 to define an opening 122 to be connected to the receiving space 112. The guide pattern 126 may extend to the inside of the opening 122 to contact and support the surface of the semiconductor device 10.

In an example embodiment, the fixing frame 124 may be inserted in the inner side portion of the insert body 110 that defines the receiving space 112. The opening region (R) of the support frame 120 may be connected to the receiving space 112 to cover the whole surface of the semiconductor device 10 corresponding to a plane area of the semiconductor device 10. The opening region (R) of the support frame 120 may have an area substantially the same as that of the receiving space 112 where the semiconductor device 10 is to be inserted.

The guide pattern 126 may extend from the fixing frame 124 to the inside of the opening 122 to contact the surface of the semiconductor device 10 where the connection pads 10 are to be formed, to thereby support the semiconductor device 10. The guide pattern 126 having fine widths (W) and thicknesses (T) may guide the connections pads 12 of the semiconductor device 10. Accordingly, the semiconductor device 10 may be seated on the seating surface of the guide pattern 126 corresponding to the opening 122.

In an example embodiment, the guide pattern 126 may be formed in a peripheral region of the opening region R. As illustrated in FIG. 5, one, two or three connection pads 12 may be exposed and guided by lattice patterns of the guide pattern 126. However, it should be understood that the guide pattern 126 may have various widths, thicknesses and arrangements according to types of the semiconductor device to be tested.

Alignment holes 128 may be formed in the fixing frame 124 of the support frame 120. The alignment holes 128, as described later, may align the support frame 120 to be inserted into a mold for forming the insert body 110.

For example, the insert body 110 may include a resin such as, for example, polyetherimide. In an example embodiment, the insert body 110 may be formed using the resin by, for example, an injection molding process. The insert body 110 may be formed using, for example, ULTEM® (produced by General Electric Company).

For example, the support frame 120 may include a metal treated by antistatic additives. Examples of the metal may include but are not limited to copper (Cu), aluminum (Al), lead (Pb), etc. For example, a photolithography process may be performed on a metal film to form a preliminary support frame having the opening 122 and the guide pattern 126. Then, the preliminary support frame may be treated by, for example, antistatic additives to form the support frame 120.

In an example embodiment, after the support frame 120 is inserted into the mold for forming the insert body 110, the support frame 120 including a metal treated by antistatic additives may be formed integrally with the insert body 110 to form the insert module 100.

Accordingly, the guide pattern 126 of the support frame 120 having fine widths (W) and thicknesses (T) may be formed to have, for example, improved hardness and durability, small deflection and uniform surface characteristics, to thereby support the reliably the semiconductor device 10.

Figure 6:
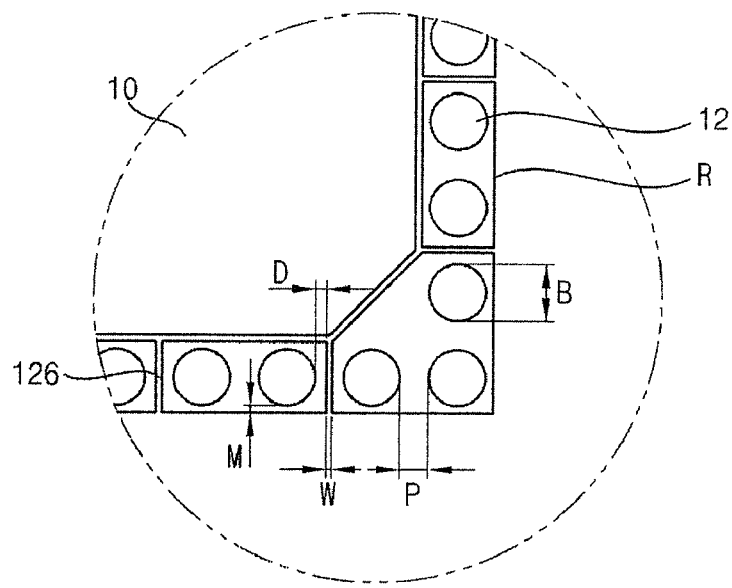
FIG. 6 is an enlarged view illustrating an 'A' portion of FIG. 5.

FIG. 6 is an enlarged view illustrating an 'A' portion of FIG. 5.

Referring to FIG. 6, the semiconductor device 10 is exposed by the opening 122 of the support frame 120 and the connection pads 12 of the semiconductor device 10 are guided and exposed by the guide pattern 126.

In an example embodiment, the externally protruding connection pads 12 may be formed in the peripheral region of the semiconductor device 10. The guide pattern 126 may be formed in the peripheral region of the opening region (R) to guide the connection pads 12 of the semiconductor device 10. Accordingly, the semiconductor device 10 may be supported stably by the guide pattern 12.

As a photolithography process is performed on the metal film to form the support frame 120, the support frame 120 may have a thickness and a width smaller than a conventional resin support structure formed by an injection molding process.

For example, the width (W) of the guide pattern 126 may be no more than about 0.14 mm and the thickness (T) of the guide pattern 126 may be no more than about 0.14 mm. In particular, the width (W) of the guide pattern 126 may range from about 0.05 mm to about 0.14 mm. The thickness (T) of the guide pattern 126 may range from about 0.05 mm to about 0.14 mm.

As illustrated in FIGS. 3, 5 and 6, the semiconductor device 10 to be inserted to the insert module 100 may be an EML (Edge Margin Less) package having an edge margin of about no more than about 0.1 mm. The outermost connection pad 12 may be spaced apart from the edge of the semiconductor device 10 by no more than about 0.1 mm.

For example, a distance (M) between the outermost connection pad 12 and the edge of the semiconductor device 10 may be about 0.06 mm. In here, a diameter (B) of the connection pad 12 may be about 0.45 mm and a distance between the adjacent connection pads 12 may be about 0.325 mm.

In an example embodiment, the width (W) of the guide pattern 126 extending to the inside of the opening 122 may be about 0.1 mm and the thickness (T) of the guide pattern 126 may be about 0.1 mm. The distance (D) between the guide pattern 126 and the connection pad 12 may be about 0.125 mm.

Accordingly, because the support frame 120 is formed by performing a photolithography process on the metal film, the support frame 120 may have a fine width and thickness, to thereby seat and support reliably a semiconductor device such as the semiconductor package with the small edge margin and having the connection pads spaced apart from each other by a small distance.

Figure 7:
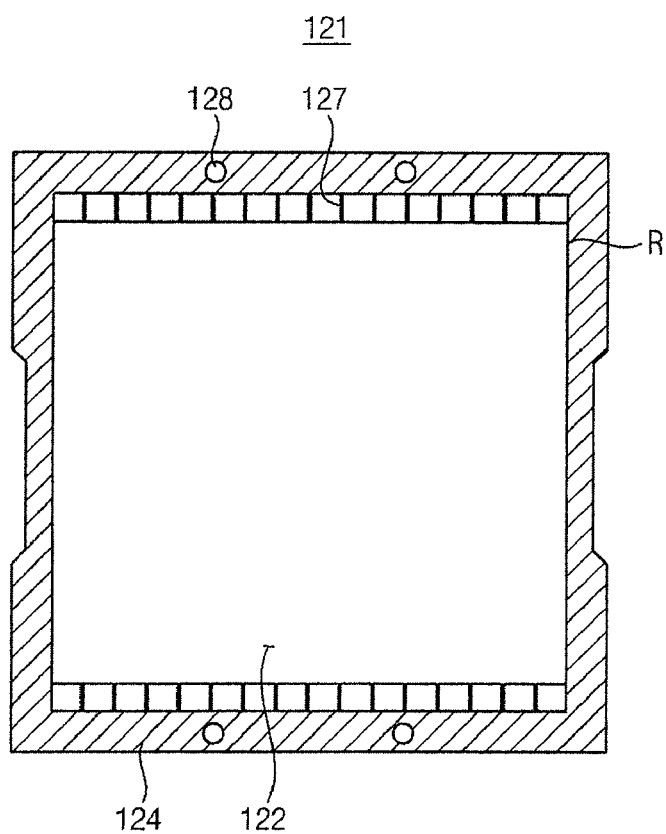
FIG. 7 is a plan view illustrating a support frame formed in an insert module for a test handler in accordance with an example embodiment.
Figure 8:
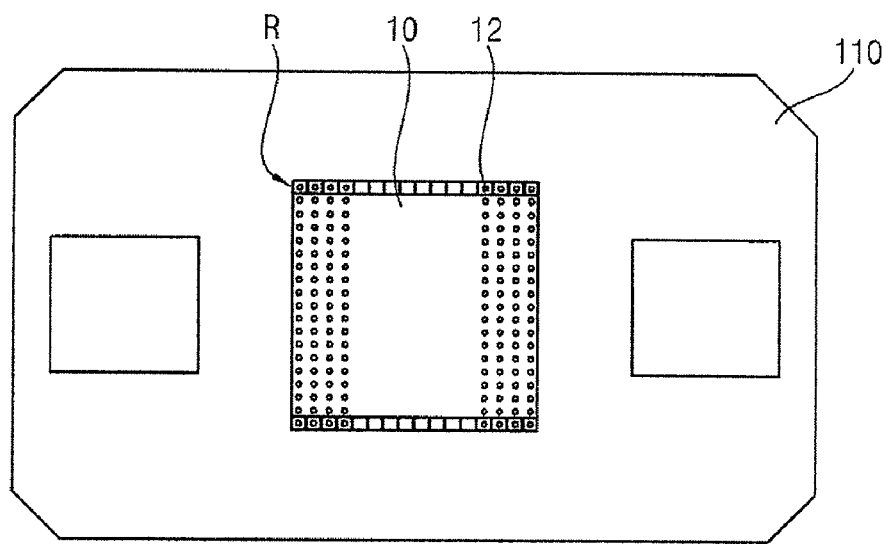
FIG. 8 is a bottom view illustrating the insert module where a semiconductor device is to be inserted in FIG. 7.

FIG. 7 is a plan view illustrating a support frame formed in an insert module for a test handler in accordance with another example embodiment. FIG. 8 is a bottom view illustrating the insert module where a semiconductor device is to be inserted in FIG. 7. The insert module of the present embodiment is substantially the same as in the embodiment described in connection with FIG. 1 except a support frame. Thus, the same reference numerals will be used to refer to the same or like parts as those described in the described in connection with FIG. 1 and any further repetitive explanation concerning the above elements will be omitted.

Referring to FIGS. 7 and 8, in another example embodiment, a guide pattern 127 of an insert module 121 may be arranged along both side portions of the opening region (R) opposite to each other.

The semiconductor device 10 may be seated on the seating surface of the guide pattern 127 corresponding to the opening region (R). The connections pads 12 may be formed to protrude from the surface of the semiconductor device 10. The connection pads 12 arranged along both side portions of the semiconductor device 10 opposite to each other may be guided and exposed by the corresponding guide pattern 127.

As illustrated in FIG. 8, one connection pad 12 may be exposed and guided by lattice patterns of the guide pattern 127. However, it should be understood that the guide pattern has various arrangements according to types of the semiconductor device to be tested.

Hereinafter, a method of manufacturing an insert module for a test handler in accordance with an example embodiment will be described in detail.

FIGS. 9 to 13 are views illustrating a method of manufacturing the insert module for a test handler in FIG. 1.

Figure 9:
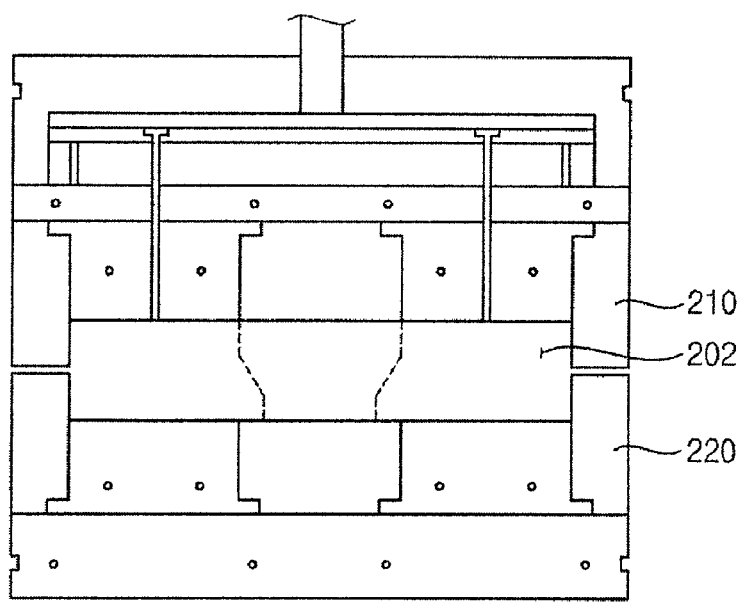
FIGS. 9 to 13 are views illustrating a method of manufacturing the insert module for a test handler in FIG. 1.

Referring to FIG. 9, a mold 200 for forming an insert body having a receiving spacer where a semiconductor device is to be inserted is prepared.

In an example embodiment, the mold 200 may be two-plate molds having an upper mold 210 and a lower mold 220. Alternatively, the mold 200 may be three-plate molds.

The upper mold 210 and the lower mold 220 are combined with each other to form a cavity 202 for forming the insert body 110, as illustrated in FIG. 1. As mentioned above, the insert body 110 has the receiving spacer 112 where a semiconductor device is to be tested.

Figure 10:
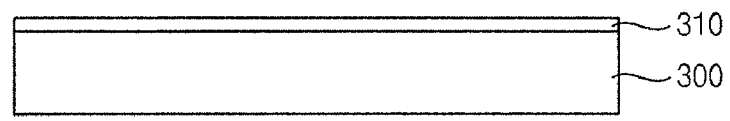
Figure 11:
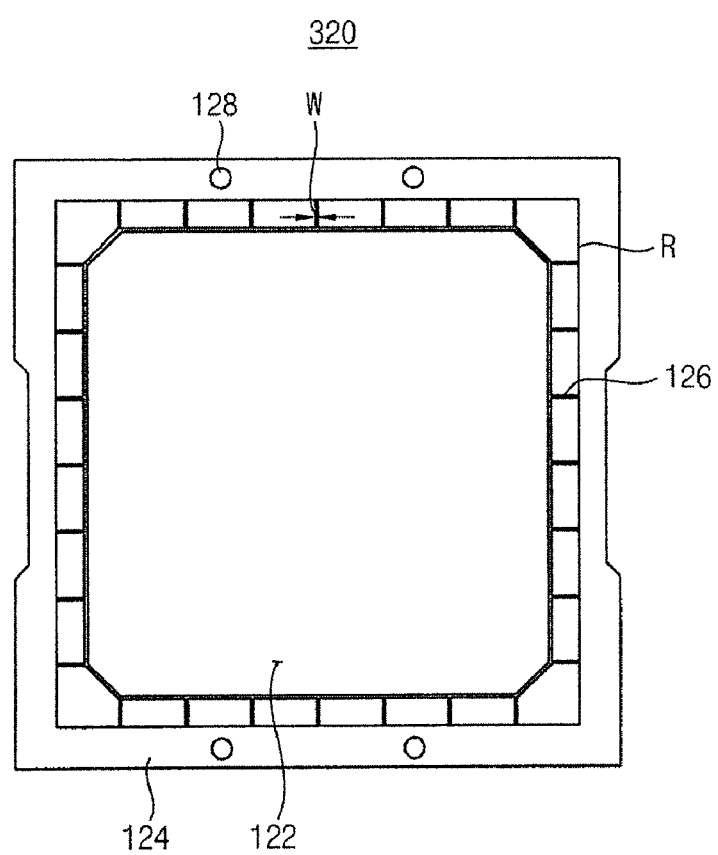

Referring to FIGS. 10 and 11, the support frame 120 having the opening 122 and the guide pattern 126 extending from the inside of the opening 122 is formed by, for example, a photolithography process. The support frame 120 may include, for example, a metal treated by antistatic additives.

Referring to FIG. 10, a metal material is deposited on a substrate 300 to form a metal film 310 on the substrate 300. For example, the metal film 310 may be formed by a deposition process. Examples of the metal material may include but are not limited to copper (Cu), aluminum (Al), lead (Pb), etc.

Referring to FIG. 11, the metal film 310 is patterned to form a preliminary support frame 320.

In an example embodiment, the metal film 310 is etched to form the preliminary support frame 320. The preliminary support frame 320 may include the fixing frame 124 defining the opening 122 and the guide pattern 126 extending from the fixing frame 124 to the inside of the opening 122.

For example, the width (W) of the guide pattern 126 may be no more than about 0.14 mm and the thickness (T) of the guide pattern (126) may be no more than about 0.14 mm. In particular, the width (W) of the guide pattern 126 may range from about 0.05 mm to about 0.14 mm. The thickness (T) of the guide pattern 126 may range from about 0.05 mm to about 0.14 mm. In an example embodiment, the width (W) of the guide pattern 126 extending to the inside of the opening 122 may be about 0.1 mm and the thickness (T) of the guide pattern 126 may be about 0.1 mm.

Then, the preliminary support frame 320 may be treated by antistatic additives to form the support frame 120 in FIG. 4.

In an example embodiment, antistatic additives may be coated on a surface of the preliminary support frame 320 to form the support frame 120. For example, a target material such as oxide may be deposited on the surface of the preliminary support frame 320. The support frame 120 formed by treating antistatic additives may have a sheet resistance of, for example, about $10^8$ $\Omega/cm^2$ to about $10^{10}$ $\Omega/cm^2$.

Figure 12:
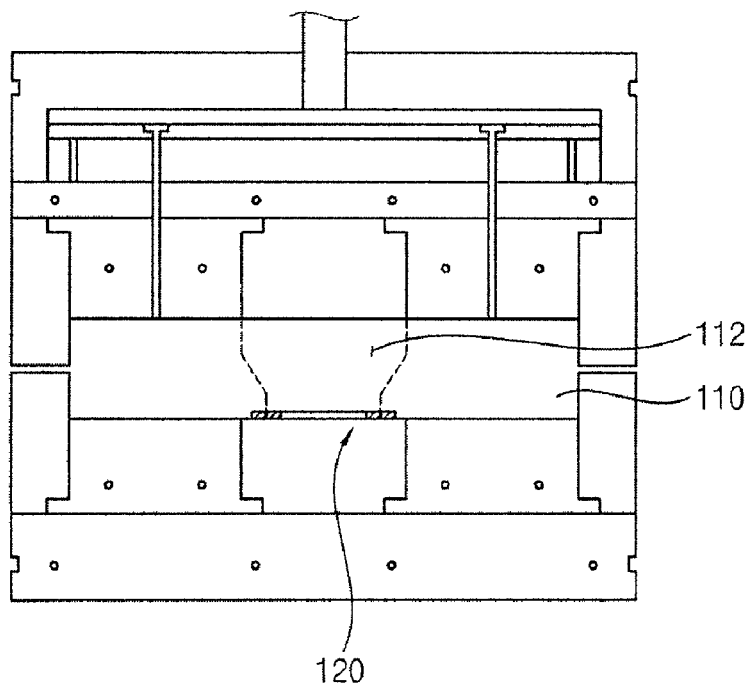

Referring to FIG. 12, the support frame 120 is inserted into the mold 200.

In an example embodiment, the support frame 120 may be arranged using the alignment holes 128 in the mold 200 such that the support frame 120 is positioned in the inner side portion of the insert body 110 defining the receiving space 112.

Figure 13:
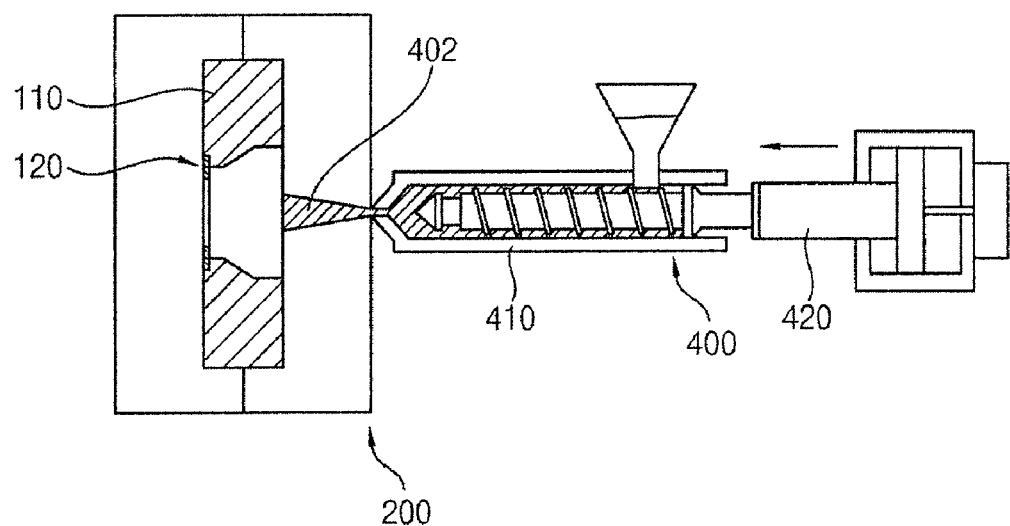

Referring to FIG. 13, a molten resin 402 is injected into the cavity 202 of the mold 200 by an injection molding apparatus 400. Then, after the molten resin 402 is cooled and solidified, the solidified resin 402 is separated from the mold 200 to form the insert module for a test handler 100 in FIG. 1.

The injection molding apparatus 400 is connected to the mold 200 and the resin 402 is injected into a cylinder 410 of the injection molding apparatus 400. Then, a piston 420 presses the resin 402 to inject the resin 402 into the cavity 202. After the resin 402 is cooled and solidified, the solidified resin 402 is removed from the mold 200 to form the insert module 100 for a test handler in FIG. 1.

As illustrated in FIG. 1, the fixing frame 124 of the support frame 120 including a metal treated by antistatic additives may be inserted into the insert body 110 and formed integrally with the insert body 110 to form the insert module 100.

As a photolithography process is performed on the metal film to form the support frame 120, the support frame 120 may have a thickness and a width smaller than a conventional resin support structure formed by an injection molding process. Further, the support frame 120 including metal may have improved hardness and durability, small defection and uniform surface characteristics, compared with a conventional resin support structure. Accordingly, the guide pattern 126 of the support frame 120 may guide and support the outermost connection pads of the EML package.

Hereinafter, a method of testing a semiconductor device using an insert module in accordance with an example embodiment will be described in detail.

Figure 14:
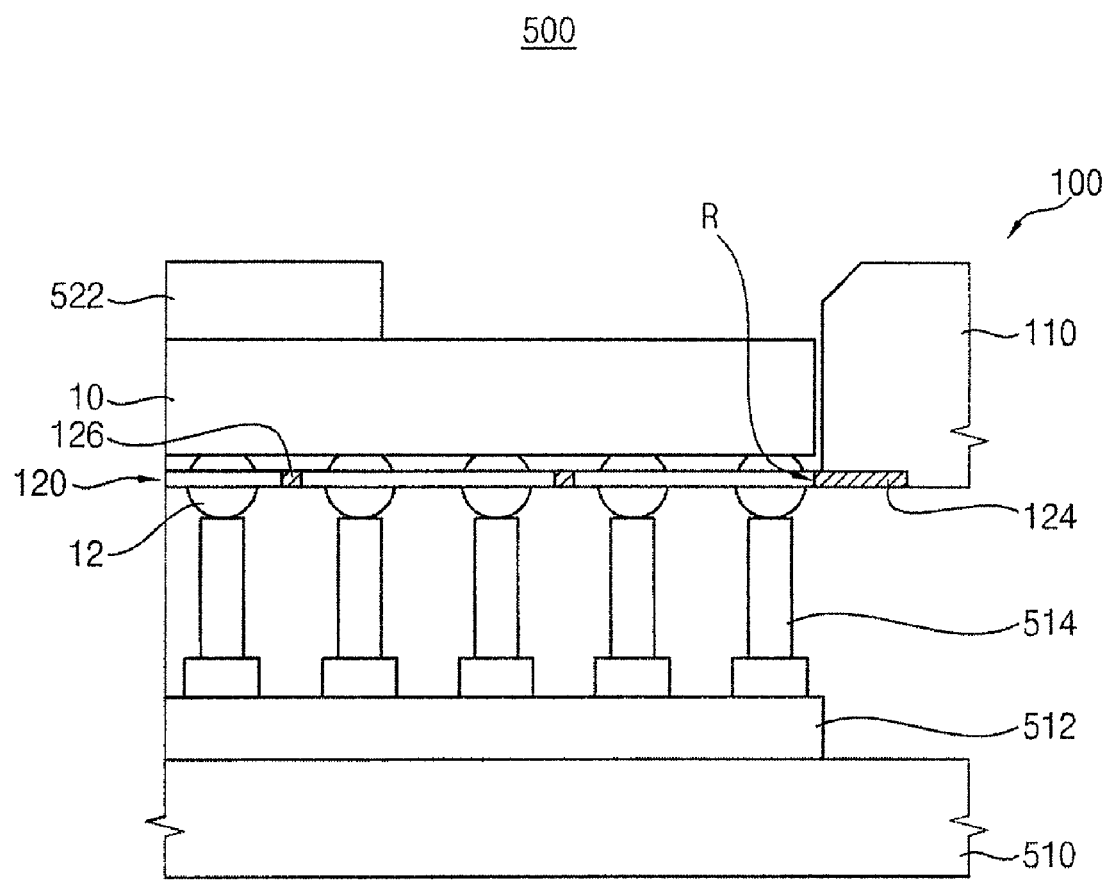
FIG. 14 is a cross-sectional view illustrating a test handler for testing a semiconductor device to be inserted into the insert module in FIG. 1.

FIG. 14 is a cross-sectional view illustrating a test handler for testing a semiconductor device to be inserted into the insert module in FIG. 1.

Referring to FIG. 14, a test handler 500 may include a test board 510 having a socket 512 electrically connected to the connection pads 12 of the semiconductor device 10, a test tray having the insert module 100 for receiving the semiconductor device 10 and a match plate having a pusher unit 522 for electrical connections between the connection pads 12 of the semiconductor device 10 and needles 514 of the socket 512 based on a determination of the position of the test tray.

In an example embodiment, the semiconductor device 10 to be tested may be, for example, an EML (Edge Margin Less) package having an edge margin of about no more than about 0.1 mm. The fixing frame 124 of the support frame 120 is inserted into and fixed with the insert body 110. The fixing frame 124 has the opening 122 that exposes the whole surface of the semiconductor device 10 where the connection pads 12 are formed.

The guide pattern 126 is formed to extend from the fixing frame 124 to the inside of the opening 122. As the guide pattern 126 is patterned by an etching process, the guide pattern 126 may have a thickness and a width smaller than those of a conventional resin support structure. Further, the guide pattern 126 including metal may have improved hardness and durability, compared with a conventional resin support structure. Accordingly, the guide pattern 126 of the support frame 120 may guide and support the outermost connection pads 12 that are formed spaced apart by no more than about 0.1 mm from the edge of the semiconductor device 10. Thus, the insert module 100 having the metal support frame 120 formed integrally therein may receive and hold the semiconductor device such as, for example, the EML package, to thereby provide a precise electrical test of the semiconductor device.

As mentioned above, an insert module for a test handler according to example embodiments includes a resin insert body having a receiving space for receiving a semiconductor device and a metal support frame integrally formed in the insert body. The support frame has a guide pattern that contacts the semiconductor device and guides connection pads of the semiconductor device.

As a photolithography process is performed on a metal film to form the support frame, the support frame may have a thickness and a width smaller than those of a conventional resin support structure. Further, the support frame may have improved hardness and durability, small deflection and uniform surface characteristics, compared with a conventional resin support structure.

Accordingly, the guide pattern of the support frame may guide and support the outermost connection pads that are formed spaced apart by no more than about 0.1 mm from the edge of the semiconductor device.

Having described the example embodiments of the present invention, it is further noted that it is readily apparent to those of reasonable skill in the art that various modifications may be made without departing from the spirit and scope of the invention which is defined by the metes and bounds of the appended claims.

What is claimed is:

1. An insert module for a test handler, comprising:
an insert body having a receiving space for receiving a semiconductor device, wherein the semiconductor device has connection pads protruding externally from a surface of the semiconductor device; and
a support frame formed in an inner side portion of the insert body defining the receiving space to provide a seating surface for contacting and supporting the semiconductor device, wherein the support frame includes a fixing frame and a guide pattern, wherein the fixing frame is inserted into and fixed with the insert body and defines an opening that exposes the semiconductor device, and wherein the guide pattern extends from the fixing frame to the inside of the opening to contact the semiconductor device and guide the connection pads.

2. The insert module of claim 1, wherein the opening has an area corresponding to a plane area of the semiconductor device.

3. The insert module of claim 1, wherein the guide pattern is formed in a peripheral region of the opening and the guide pattern guides the connection pads arranged in a peripheral region of the semiconductor device.

4. The insert module of claim 1, wherein the insert body comprises a resin and the support frame comprises a metal treated by antistatic additives.

5. The insert module of claim 4, wherein the metal of the support frame comprises at least one selected from the group consisting of copper (Cu), aluminum (Al) and lead (Pb).

6. The insert module of claim 4, wherein the guide pattern is formed by performing a photolithography process on a metal film.

7. The insert module of claim 4, wherein the support frame is formed integrally with the insert body by an injection molding process.

8. The insert module of claim 1, wherein a width of the guide pattern is no more than about 0.14 mm.

9. The insert module of claim 8, wherein the outermost connection pad of the externally protruding connection pads is spaced apart from the edge of the semiconductor device by no more than about 0.1 mm.

10. The insert module of claim 8, wherein a thickness of the guide pattern is no more than about 0.14 mm.

11. The insert module of claim 1, further comprising a guiding hole and combining holes formed in side portions of the insert body for guiding and combining of the insert module in the test handler.

12. The insert module of claim 1, wherein the resin of the insert body is polyetherimide.

* * * * *